United States Patent
Pham et al.

(10) Patent No.: US 9,036,729 B2
(45) Date of Patent: May 19, 2015

(54) CODE FORWARDING AND CLOCK GENERATION FOR TRANSMITTER REPEATERS

(71) Applicant: LSI Corporation, San Jose, CA (US)

(72) Inventors: Hiep Pham, Campbell, CA (US); Chaitanya Palusa, San Jose, CA (US); Tomasz Prokop, San Jose, CA (US); Adam Healey, Newburyport, MA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 14 days.

(21) Appl. No.: 13/873,003

(22) Filed: Apr. 29, 2013

(65) Prior Publication Data

US 2014/0233668 A1 Aug. 21, 2014

Related U.S. Application Data

(60) Provisional application No. 61/766,213, filed on Feb. 19, 2013.

(51) Int. Cl.
| | |
|---|---|
| *H04L 7/00* | (2006.01) |
| *H04L 27/12* | (2006.01) |
| *H03L 7/06* | (2006.01) |
| *H03L 7/08* | (2006.01) |
| *H04L 7/027* | (2006.01) |
| *H03L 7/099* | (2006.01) |

(52) U.S. Cl.
CPC ............ *H04L 27/122* (2013.01); *H04L 7/0012* (2013.01); *H03L 7/0998* (2013.01); *H04L 7/0016* (2013.01); *H03L 7/06* (2013.01); *H04L 7/0029* (2013.01); *H04L 7/0025* (2013.01); *H03L 7/0807* (2013.01); *H04L 7/027* (2013.01)

(58) Field of Classification Search
CPC ... H04L 7/0012; H04L 7/0016; H04L 7/0029; H04L 7/027; H04L 7/0025; H03L 7/06; H03L 7/0807
USPC ........... 375/316, 354, 356, 376; 327/156, 158
See application file for complete search history.

(56) References Cited

U.S. PATENT DOCUMENTS

| | | | |
|---|---|---|---|
| 7,349,506 B2 | 3/2008 | Shizuki | |
| 7,532,697 B1 * | 5/2009 | Sidiropoulos et al. | 375/376 |
| 7,577,226 B2 | 8/2009 | Sou | |
| 8,477,895 B1 * | 7/2013 | Wang et al. | 375/354 |
| 2005/0286669 A1 * | 12/2005 | Buchwald et al. | 375/356 |

* cited by examiner

*Primary Examiner* — Daniel Washburn
*Assistant Examiner* — Eboni Hughes
(74) *Attorney, Agent, or Firm* — Suiter Swantz pc llo

(57) ABSTRACT

A repeater includes a clock-and-data recovery element and a phase interpolator to extract an embedded clock frequency from a data stream. The phase interpolator determine a frequency offset and sends such offset as phase interpolator codes to a filter and scaler. The filtered, scaled phase interpolator codes are used to produce a reference clock frequency for retransmission.

17 Claims, 3 Drawing Sheets

CODE FORWARDING AND CLOCK GENERATION FOR TRANSMITTER REPEATERS

PRIORITY

The present application claims the benefit under 35 U.S.C. §119(e) of U.S. Provisional Application Ser. No. 61/766,213, filed Feb. 19, 2013, which is incorporated herein by reference.

BACKGROUND OF THE INVENTION

In communication systems, digital signals often need to be received and then retransmitted by a repeater. Received signals and retransmitted signals can be in different signaling and coding schemes. When signals are retransmitted, both the data portion of the signal and the clock portion of the signal are recovered and the data portion undergoes digital signal processing. The clock frequency of the received signal is often not aligned with the local clock frequency of the retransmitting receiver (frequency offset) or the frequency ratio of the received clock signal and the transmitter clock signal is such that it causes some small error when the clock portion and data portion are re-combined. The clock portion of the signal can accumulate small errors during several retransmissions, seriously degrading the signal.

Consequently, it would be advantageous if an apparatus existed that is suitable for maintaining clock signal integrity during retransmission of a digital signal.

SUMMARY OF THE INVENTION

Accordingly, the present invention is directed to a novel method and apparatus for maintaining clock signal integrity during retransmission of a digital signal.

In one embodiment of the present invention, a repeater receives a data stream and extracts the embedded clock frequency in the form of phase interpolator codes. A phase interpolator is used to generate a clock signal from the local receiver clock with the same frequency as the clock signal embedded in received data. The phase interpolator codes s are also sent to a filter and scaler. The filtered, scaled phase interpolator codes are used to produce a transmitting clock based on a local transmitter clock In another embodiment of the present invention, a method for retransmitting data signals includes extracting an embedded clock signal in the form of phase interpolator codes. The phase interpolator codes are filtered to remove jitter and scaled according to a ratio of frequencies. The scaled phase interpolator codes are then used to produce a transmission reference clock frequency.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
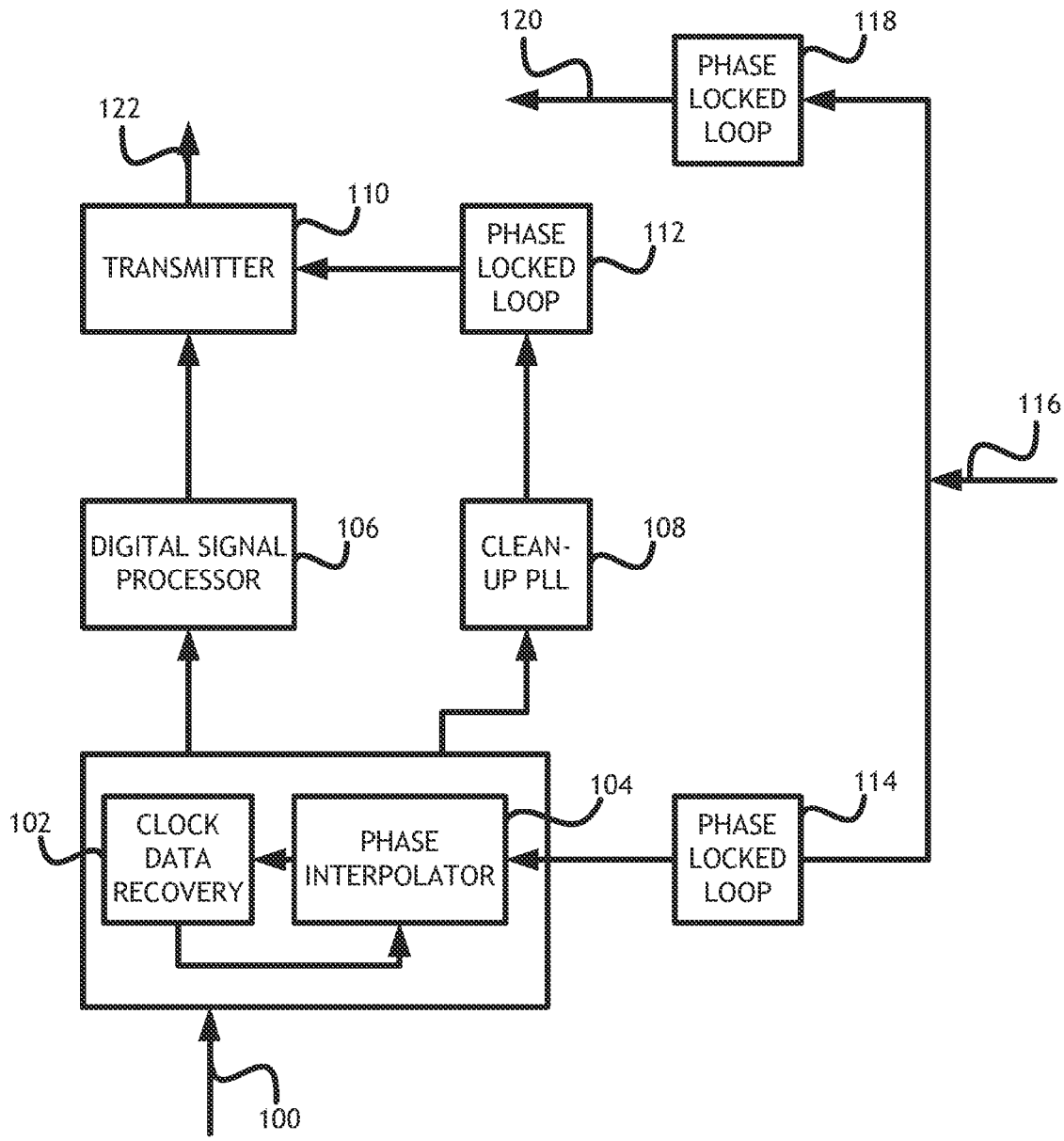
FIG. 1 shows a block diagram of a system for clock forwarding in a transmitter repeater.

Referring to FIG. 1, a block diagram of a system for clock forwarding in a transmitter repeater is shown. A data stream 100 received by a receiver has embedded clock data with a slightly different frequency as compared to a frequency generated by a local receiver clock phase locked loop 114 based on a reference clock signal 116. The receiver comprises a clock-and-data recovery circuit 102 and a phase interpolator 104. The clock-and-data recovery circuit 102 and phase interpolator 104 interact to recover the clock frequency embedded in the data stream 100. The clock frequency recovered from the data stream 100 (recovered clock) and corresponding data are sent to a transmitter to retransmit and ensure there are no accumulated bit errors. The data from the data stream 100 passes through a digital signal processor 106 on the way to a transmitter 110.

The recovered clock is jittery because the data stream 100 includes embedded jitter. To compensate for recovered clock jitter, a clean-up phase locked loop 108 receives the recovered clock frequency from the receiver; more particularly, the output from the phase interpolator 104. The clean-up phase locked loop 108 requires substantial power and silicon area, and possibly an off-chip (external) voltage controlled crystal oscillator.

On the transmission side, a transmitter 110 receives data from a digital signal processor 106 and a transmission clock frequency from a first transmitter phase locked loop 112. The transmitter 110 combines the data and the transmission clock frequency to produce a transmission data stream 122. A second transmitter phased locked loop 118 also produces a clock frequency based on a reference clock signal 116.

For example; a repeater having a local reference clock signal 116 with a frequency of 156.25 MHz and a local receiver clock phase locked loop 114 configured to multiply local reference clock signal 116 by one hundred sixty-five times produces a reference frequency to a phase interpolator 104 of 25.7813 GHz. The phase interpolator 104 and clock-and-data recovery circuit 102 interact to produce a recovered clock frequency from the data stream 100 of 25.7838 GHz. The recovered clock frequency is sent to a clean-up phase locked loop 108 configured to apply a fractional multiplier to the recovered clock frequency and generate the fractionally multiplied recovered clock frequency to the first transmitter phase locked loop 112. The first transmitter phase locked loop 112 multiplies the fractionally multiplied recovered clock frequency by a fractional multiplier equal to the multiplier applied by a second transmitter phase locked loop 118 and the inverses of the clean-up phase locked loop 108 and the local receiver clock phase locked loop 114. In the current example, the second transmitter phase locked loop 118 is configured to multiply the local reference clock signal 116 by eighty-seven to produce a transmitter reference clock frequency of 13.593 GHz. Therefore the first transmitter phase locked loop 112 is configured to multiply the fractionally multiplied recovered clock frequency by eighty-seven one hundred sixty-fifths (87/165), and by whatever fractional quantity was used by the clean-up phase locked loop 108 to compensate for jitter. The first transmitter phase locked loop 112 sends a clock frequency of 13.595 GHz to the transmitter 110.

Figure 2:
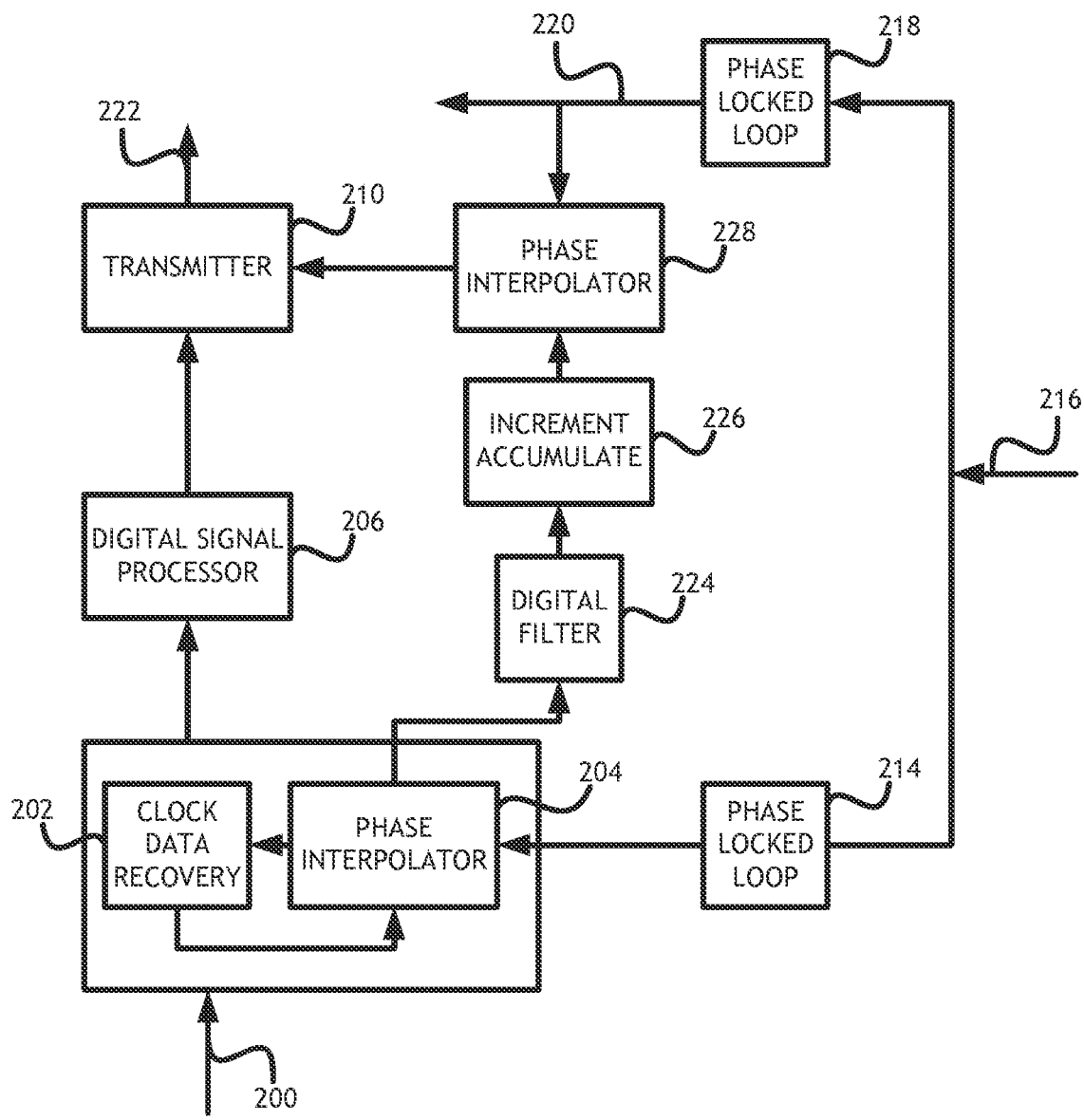
FIG. 2 shows a block diagram of a system for code forwarding in a transmitter repeater.

Referring to FIG. 2, a block diagram of a system for code forwarding in a transmitter repeater is shown. Instead of a recovered clock frequency, receiver phase interpolator 204 codes are sent to the transmitter 210. In at least one embodiment, a data stream 200 received by a receiver has embedded clock data. The receiver comprises a clock-and-data recovery circuit 202 and a receiver phase interpolator 204. The receiver phase interpolator 204 receives a reference frequency from a local receiver clock phase locked loop 214 based on a reference clock signal 216. The clock-and-data recovery circuit 202 and receiver phase interpolator 204 interact to recover the clock frequency embedded in the data stream 200 and produce phase interpolator codes comprising data jitter information and frequency offset information. The clock-and-data recovery circuit 202 produces frequency offset data by rolling phase interpolator codes. The phase interpolator codes from the data stream 200 and corresponding data are sent to a transmitter to retransmit and ensure there are no accumulated bit errors. The data from the data stream 200 passes through a digital signal processor 206 on the way to a transmitter 210.

The phase interpolator codes are sent to a digital filter 224. In at least one embodiment, the digital filter 224 is configured to remove data jitter information. In at least one embodiment, the digital filter 224 has a low cut-off corner. Filtered phase interpolator codes are then sent from the digital filter 224 to a code incrementer and accumulator 226 configured to scale the filtered phase interpolator codes. The code incrementer and accumulator 226 generates a corresponding rate of rolling code that is incorporated into scaled phase interpolator codes. The scaled phase interpolator codes are sent to a transmitter phase interpolator 228. The transmitter phase interpolator 228 uses the scaled phase interpolator codes and a reference frequency from a transmitter phase locked loop 218 to produce a transmission clock frequency which is sent to the transmitter 210. The transmitter 210 combines the data and the transmission clock frequency to produce a transmission data stream 222.

In one exemplary embodiment; a repeater having a local reference clock signal 216 with a frequency of 156.25 MHz and a local receiver clock phase locked loop 214 configured to multiply the local reference clock signal 216 by one hundred sixty-five times produces and sends a reference frequency of 25.7813 GHz to a phase interpolator 204. The phase interpolator 204 and clock-and-data recovery circuit 202 interact to produce phase interpolator codes including data jitter and frequency offset information. The phase interpolator codes are sent to a digital filter 224 configured to remove data jitter information and send the filtered phase interpolator codes to a code incrementer and accumulator 226. The code incrementer and accumulator 226 scales the filtered phase interpolator codes and sends the scaled phase interpolator codes to a transmitter phase interpolator 228. In the current example, the transmitter phase interpolator 228 is configured to produce a clock frequency of 13.595 GHz based on the scaled phase interpolated codes and transmitter reference clock frequency from a transmitter phase locked loop 218. The transmitter phase locked loop 218 produces the transmitter reference clock frequency of 13.593 GHz by multiplying the local reference clock signal 216 by eighty-seven.

In the foregoing examples, the phase locked loop multiplier quantities (87 and 165) are defined by the operating properties of the transmitter and receiver respectively. Such quantities are specific to particular machines and should not be viewed as limiting.

Phase interpolator codes are low speed digital signals. Low speed digital signals are easier to process and require less circuitry than high speed clock signals. Forwarding phase interpolator codes rather than forwarding and manipulating clock frequencies implements a ratio of code jumps between the receiver and the transmitter when retransmitting. The example described herein illustrates a ratio of 87/165; so for every one hundred sixty-five code jumps in the receiver phase interpolator codes, the transmitter phase interpolator codes should jump exactly eighty-seven times.

In one exemplary implementation, eighty-seven phase interpolator codes jumps on the receiver side produce eighty-seven phase interpolator code jumps on the transmitter side, and the remaining phase interpolator code jumps on the receiver side (seventy-eight) produce no phase interpolator code jumps on the transmitter side. The remaining phase interpolator code jumps on the receiver side (seventy-eight) can be distributed among the eighty-seven phase interpolator code jumps on the transmitter side. In another embodiment, phase interpolator code jumps are stored in a memory table to control the distribution of transmitter phase interpolator code jumps.

The transmitter phase interpolator code jump will cause a deterministic jitter equal to phase interpolator resolution which is usually ignorable. If better deterministic jitter is desired, a phase interpolator with finer resolution can be used.

Figure 3:
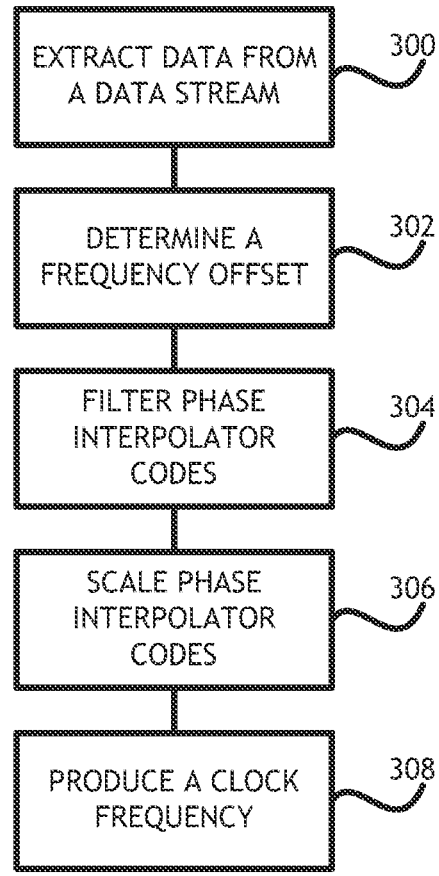
FIG. 3 shows a flowchart of a method for retransmitting a signal according to the present invention.

Referring to FIG. 3, a flowchart of a method for retransmitting a signal according to the present invention is shown. In at least one embodiment of the present invention, a repeater receives a data stream to retransmit. Data is extracted 300 from the data stream and a frequency offset is determined 302 based on a reference clock frequency. The frequency offset, in the form of phase interpolator codes, is filtered 304 to remove jitter. The filtered phase interpolator codes are then scaled 306 according to a ratio of the operating frequencies of the transmitter and receiver. The scaled phase interpolator codes are then used in conjunction with a reference clock frequency to produce 308 a transmission clock frequency. The transmission clock frequency and data from the original data stream are then combined and retransmitted.

Figure 4:
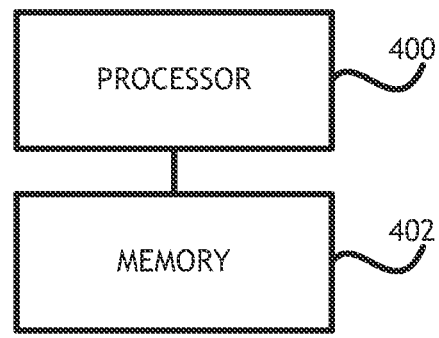
FIG. 4 shows a block diagram of a computing device useful for implementing embodiments of the present invention.

Referring to FIG. 4, a block diagram of a computing device useful for implementing embodiments of the present invention is shown. The computing device includes a processor 400 and memory 402 connected to the processor. The processor 400 receives a data stream and extracts embedded clock data from the data stream. The processor than determines a frequency offset based on the extracted clock data and a reference clock frequency. In at least one embodiment, the processor scales the frequency offset value based on a ratio of transmitter to receiver frequencies and produces a transmitter reference clock frequency.

It is believed that the present invention and many of its attendant advantages will be understood by the foregoing description of embodiments of the present invention, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A repeater comprising:
   a scaling circuit connected to a signal receiving device;
   a receiver phase interpolator connected to the signal receiving device;
   a transmitting device comprising:
      a transmitter;
      a transmitter phase interpolator connected to the transmitter and connected to the scaling circuit; and
      a transmitter phase locked loop connected to the transmitter phase interpolator,
   wherein:
      the receiver phase interpolator is configured to receive a reference clock frequency and produce one or more receiver phase interpolator codes;
      the scaling circuit is configured to produce one or more scaled phase interpolator codes based on the receiver phase interpolator codes;
      the transmitter phase locked loop is configured to receive the reference clock frequency and produce a transmitter reference clock frequency; and
      the transmitter phase interpolator is configured to produce a transmission clock frequency based on the transmitter reference dock frequency and the one or more scaled phase interpolator codes.

2. The repeater of claim 1, further comprising a digital filter interposed between the scaling circuit and the signal receiving device, the digital filter configured to remove jitter from the one or more receiver phase interpolator codes.

3. The repeater of claim 2, wherein the digital filter comprises a low cut-off corner.

4. The repeater of claim 1, wherein the scaling circuit is configured to scale the one or more receiver phase interpolator codes according to a ratio of a multiplier associated with a receiver phase locked loop and a multiplier associated with the transmitter phase locked loop.

5. The repeater of claim 1, further comprising a digital signal processing element connected to the signal receiving device and the transmitter, the digital signal processing element configured to process data from a data stream.

6. The repeater of claim 1, wherein the transmitter is configured to embed the reference clock frequency into a transmission data stream.

7. A computer apparatus comprising:
   a processor; and
   memory connected to the processor;
   wherein the processor is configured to:
      receive a data stream;
      extract a receiver reference clock frequency from the data stream;
      determine a receiver clock frequency offset based on the receiver clock frequency and a reference clock frequency;
      convert the receiver clock frequency offset to one or more phase interpolator codes;
      scale the one or more phase interpolator codes;
      produce a transmitter reference clock frequency based on the reference clock frequency with a phase locked loop;
      produce a transmission clock frequency based on the one or more scaled phase interpolator codes and the transmitter reference clock frequency;
      combine the transmission clock frequency with the data stream; and
      retransmit the combined transmission clock frequency and data stream.

8. The computer apparatus of claim 7, wherein the processor is further configured to remove jitter from the one or more phase interpolator codes.

9. The computer apparatus of claim 7, wherein the processor is further configured to scale the one or more phase interpolator codes according to a ratio of a multiplier associated with the receiver reference clock frequency and a multiplier associated with the transmitter reference clock frequency.

10. The computer apparatus of claim 7, wherein the processor is further configured to process data from the data stream.

11. The computer apparatus of claim 7, wherein the processor is further configured to embed the reference clock frequency into a transmission data stream.

12. A method for retransmitting a signal comprising:
   receiving a data stream;
   extracting a receiver reference clock frequency from the data stream;
   determining a receiver clock frequency offset based on the receiver clock frequency and a reference clock frequency;
   converting the receiver clock frequency offset to one or more phase interpolator codes;
   scaling the one or more phase interpolator codes;
   producing a transmitter reference clock frequency based on the reference clock frequency with a phase locked loop;
   producing a transmission clock frequency based on the one or more scaled phase interpolator codes and the transmitter reference clock frequency;
   combining the transmission clock frequency with the data stream; and
   retransmitting the combined transmission clock frequency and data stream.

13. The method of claim 12, further comprising removing jitter from the one or more phase interpolator codes.

14. The method of claim 13, wherein removing jitter from the one or more phase interpolator codes comprises filtering with a low cut-off corner filter.

15. The method of claim 12, wherein scaling comprises multiplying by a ratio of a multiplier associated with the receiver reference clock frequency and a multiplier associated with the transmitter reference clock frequency.

16. The method of claim 12, further comprising processing data other than embedded clock frequency data from the data stream.

17. The method of claim 12, further comprising embedding the reference clock frequency into a transmission data stream.

* * * * *